United States Patent
Nagamine

(10) Patent No.: US 9,359,135 B2
(45) Date of Patent: Jun. 7, 2016

(54) STORAGE SHELF

(71) Applicant: MURATA MACHINERY, LTD., Kyoto-shi, Kyoto (JP)

(72) Inventor: Shohei Nagamine, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 0 days.

(21) Appl. No.: 14/767,061

(22) PCT Filed: Feb. 12, 2014

(86) PCT No.: PCT/JP2014/053201
§ 371 (c)(1),
(2) Date: Aug. 11, 2015

(87) PCT Pub. No.: WO2014/126106
PCT Pub. Date: Aug. 21, 2014

(65) Prior Publication Data
US 2016/0001976 A1    Jan. 7, 2016

(30) Foreign Application Priority Data

Feb. 12, 2013 (JP) .................... 2013-024400

(51) Int. Cl.
*B65G 1/02* (2006.01)
*H01L 21/677* (2006.01)
(Continued)

(52) U.S. Cl.
CPC . *B65G 1/02* (2013.01); *A47B 55/00* (2013.01); *F16F 15/08* (2013.01);
(Continued)

(58) Field of Classification Search
CPC .............. B65G 1/02; B65G 2201/0297; B65G 2207/20; B65G 2207/28; B65G 2207/40; A47B 55/00; H01L 21/67769; F16F 15/08

USPC ................... 211/1.5, 630, 632; 206/454, 521; 248/562, 569, 564, 566, 636; 224/309, 224/325; 267/286, 291; 411/544; 220/1.5, 220/630, 632

See application file for complete search history.

(56) References Cited

U.S. PATENT DOCUMENTS

| 1,369 | A | * | 10/1839 | Barnum | .................. | F16F 1/128 |
| | | | | | | 267/291 |
| 134,646 | A | * | 1/1873 | Culmer | .................. | B60G 11/14 |
| | | | | | | 267/180 |

(Continued)

FOREIGN PATENT DOCUMENTS

| JP | 11-351323 A | 12/1999 |
| JP | 2004-316782 A | 11/2004 |

(Continued)

OTHER PUBLICATIONS

English translation of Official Communication issued in corresponding International Application PCT/JP2014/053201, mailed on Mar. 18, 2014.

*Primary Examiner* — Joshua J Michener
*Assistant Examiner* — Devin Barnett
(74) *Attorney, Agent, or Firm* — Keating & Bennett, LLP

(57) ABSTRACT

A storage shelf reduces vibration while maintaining load-carrying capacity and includes placement units on which a FOUP is placed, and a frame unit that supports the placement units. The placement units include frames that are arranged on the frame unit with first elastic bodies interposed therebetween, and a shelf plate that is arranged on the frames with second elastic bodies interposed therebetween and is configured to place thereon the FOUP.

3 Claims, 5 Drawing Sheets

(51) Int. Cl.
*A47B 55/00* (2006.01)
*F16F 15/08* (2006.01)

(52) U.S. Cl.
CPC . *H01L 21/67769* (2013.01); *B65G 2201/0297* (2013.01); *B65G 2207/20* (2013.01); *B65G 2207/28* (2013.01); *B65G 2207/40* (2013.01)

(56) References Cited

U.S. PATENT DOCUMENTS

| | | | | |
|---|---|---|---|---|
| 149,483 | A * | 4/1874 | Jenness | F16F 1/128 267/291 |
| 388,733 | A * | 8/1888 | Sloan | B65D 5/58 119/65 |
| 1,066,825 | A * | 7/1913 | Lewis | B22C 15/10 164/206 |
| 1,151,858 | A * | 8/1915 | Brock | F16F 1/128 267/291 |
| 1,157,165 | A * | 10/1915 | Leahan | F16F 1/128 267/291 |
| 1,733,051 | A * | 10/1929 | Capes | B60N 2/502 267/28 |
| 1,811,987 | A * | 6/1931 | Wales | B21D 45/006 267/130 |
| 1,920,055 | A * | 7/1933 | Bluhm | B60G 11/14 267/286 |
| 2,545,320 | A * | 3/1951 | Tilson | B65F 1/141 220/630 |
| 2,727,638 | A * | 12/1955 | Sestan | E04H 6/225 187/217 |
| 2,918,176 | A * | 12/1959 | Bell | A47B 47/027 211/187 |
| 3,095,975 | A * | 7/1963 | Cassel | A47B 57/402 211/192 |
| 3,157,424 | A * | 11/1964 | Hall | B65G 1/0442 108/53.5 |
| 3,231,084 | A * | 1/1966 | Kean, Sr. | B65D 19/06 206/451 |
| 3,285,428 | A * | 11/1966 | Scheck | A47B 57/06 211/182 |
| 3,337,061 | A * | 8/1967 | Caudell | B65G 1/02 211/134 |
| 3,365,073 | A * | 1/1968 | Degener | A47B 57/26 211/182 |
| 3,452,887 | A * | 7/1969 | Larson | B60P 3/41 211/60.1 |
| 3,459,395 | A * | 8/1969 | Scotto | F16F 13/00 188/318 |
| 3,469,809 | A * | 9/1969 | Fekete | F16F 7/01 188/268 |
| 3,523,613 | A * | 8/1970 | Konstant | E04G 1/08 211/182 |
| 3,741,405 | A * | 6/1973 | McConnell | A47B 57/487 211/192 |
| 3,769,774 | A * | 11/1973 | Barnes | E04B 1/4157 248/58 |
| 3,794,277 | A * | 2/1974 | Smedley | F16F 7/127 174/161 R |
| 3,856,242 | A * | 12/1974 | Cook | F16F 15/06 248/548 |
| 3,948,473 | A * | 4/1976 | Mason | H02G 3/0456 174/68.3 |
| 4,007,837 | A * | 2/1977 | Rowley | B65D 85/48 206/448 |
| 4,200,256 | A * | 4/1980 | Thiel | F16F 7/12 248/548 |
| 4,278,192 | A * | 7/1981 | Sazegar | B60R 9/12 224/315 |
| 4,343,452 | A * | 8/1982 | Bauer | F16F 15/02 248/565 |
| 4,355,723 | A * | 10/1982 | Loeber | B65D 90/02 108/55.1 |
| 4,512,473 | A * | 4/1985 | Thomaswick | B65D 85/48 206/448 |
| 4,553,231 | A * | 11/1985 | d'Alayer de Costemore d'Arc | G11B 33/08 248/534 |
| 4,678,439 | A * | 7/1987 | Schlichthorst | B63H 21/305 114/65 R |
| 4,750,405 | A * | 6/1988 | deMey, II | G12B 5/00 248/636 |
| 4,763,869 | A * | 8/1988 | Nakamura | G12B 9/08 248/562 |
| 4,815,613 | A * | 3/1989 | Hollander | B65G 1/023 211/191 |
| 4,893,780 | A * | 1/1990 | Koseki | F16F 15/0275 248/550 |
| 4,941,640 | A * | 7/1990 | Nakamura | G12B 9/08 248/562 |
| 4,955,489 | A * | 9/1990 | Allen | B56G 1/026 211/151 |
| 5,056,764 | A * | 10/1991 | Mochizuki | A63H 17/26 188/321.11 |
| 5,058,756 | A * | 10/1991 | Green | B62D 53/06 220/1.5 |
| 5,156,451 | A * | 10/1992 | Pollock | G07F 9/10 248/616 |
| 5,180,068 | A * | 1/1993 | Vargo | F16B 12/10 211/191 |
| 5,285,995 | A * | 2/1994 | Gonzalez | G05D 19/02 248/550 |
| 5,316,157 | A * | 5/1994 | Konstant | A47B 53/00 211/151 |
| 5,347,507 | A | 9/1994 | Kühn | |
| 5,377,851 | A * | 1/1995 | Asano | A47B 47/022 211/191 |
| 5,433,687 | A * | 7/1995 | Hinzman | A63B 21/00047 248/580 |
| 5,531,410 | A * | 7/1996 | Simon | H02G 3/0443 248/49 |
| 5,566,156 | A | 10/1996 | Choi | |
| 5,624,045 | A * | 4/1997 | Highsmith | A47B 57/487 211/191 |
| 5,749,481 | A * | 5/1998 | Miller | A47B 16/1441 211/187 |
| 5,845,795 | A * | 12/1998 | Mulholland | A47B 57/50 211/192 |
| 6,000,671 | A * | 12/1999 | Helms | F16F 15/02 248/563 |
| 6,023,024 | A * | 2/2000 | Stjerneby | H02G 3/0443 174/95 |
| 6,092,780 | A * | 7/2000 | Kurabayashi | E04H 9/021 248/562 |
| 6,155,441 | A * | 12/2000 | Andersen | A47B 57/50 211/192 |
| 6,202,863 | B1 * | 3/2001 | Grenier | B65D 88/123 211/70.4 |
| 6,290,073 | B1 * | 9/2001 | Barnes, Sr. | F24B 15/00 211/175 |
| 6,338,409 | B1 * | 1/2002 | Neary | G03F 1/66 206/454 |
| 6,340,141 | B1 * | 1/2002 | Rinderer | H02G 3/0456 211/26 |
| 6,591,988 | B2 * | 7/2003 | Trpkovski | B65D 19/44 206/386 |
| 6,679,194 | B2 * | 1/2004 | Ham | H01L 21/67396 118/500 |
| 6,988,704 | B2 * | 1/2006 | Sievers | H05K 7/186 211/191 |
| 7,021,461 | B1 * | 4/2006 | Robey | B60P 3/07 206/335 |
| 7,175,150 | B2 | 2/2007 | Chi | |
| 7,188,993 | B1 | 3/2007 | Howe et al. | |
| 7,350,774 | B2 * | 4/2008 | Chun | F16F 1/041 267/169 |
| 7,703,729 | B1 | 4/2010 | Nourollahi | H04R 1/026 248/188.9 |
| 7,798,352 | B2 * | 9/2010 | Naruishi | B65D 19/12 220/1.5 |
| 8,083,076 | B2 * | 12/2011 | Hobbs | B66C 1/62 211/26 |
| 8,097,808 | B2 * | 1/2012 | Quertelet | H02G 3/0443 174/95 |

(56) References Cited

U.S. PATENT DOCUMENTS

| | | | | |
|---|---|---|---|---|
| 8,651,831 B2* | 2/2014 | Yagi | ................... | F04B 39/127 |
| | | | | 267/287 |
| 9,048,275 B2* | 6/2015 | Murata | ............. | H01L 21/67775 |
| 2001/0045404 A1* | 11/2001 | Pellegrino | ............. | F16B 7/0446 |
| | | | | 211/192 |
| 2001/0045503 A1* | 11/2001 | Priuli | ................... | B65G 1/0442 |
| | | | | 248/618 |
| 2002/0003194 A1* | 1/2002 | Simmons | .......... | E04F 15/02458 |
| | | | | 248/49 |
| 2002/0104950 A1* | 8/2002 | Mayama | ................. | G03F 7/709 |
| | | | | 248/638 |
| 2002/0185319 A1* | 12/2002 | Smith | .................... | B62D 55/00 |
| | | | | 180/9 |
| 2003/0116682 A1* | 6/2003 | Finco | ................... | H02G 3/0443 |
| | | | | 248/49 |
| 2004/0105655 A1* | 6/2004 | Ciulla | ..................... | H05K 7/18 |
| | | | | 211/26 |
| 2006/0038091 A1* | 2/2006 | Winn | ................... | H02G 3/0443 |
| | | | | 248/49 |
| 2006/0255517 A1 | 11/2006 | Lee et al. | | |
| 2007/0045368 A1* | 3/2007 | Lavelle | ..................... | B60R 9/00 |
| | | | | 224/524 |
| 2007/0062898 A1* | 3/2007 | Choi | .................... | A47B 57/408 |
| | | | | 211/192 |
| 2007/0119800 A1* | 5/2007 | Cornish | ................... | B65G 1/14 |
| | | | | 211/60.1 |
| 2008/0047993 A1* | 2/2008 | Wooten | .................... | B60R 9/00 |
| | | | | 224/325 |
| 2008/0277438 A1* | 11/2008 | Aftanas | .................. | B60R 9/045 |
| | | | | 224/325 |
| 2009/0127255 A1* | 5/2009 | Rood, Jr. | .............. | B65D 88/005 |
| | | | | 220/1.5 |
| 2009/0314920 A1* | 12/2009 | Vukadin | ................ | F16B 21/088 |
| | | | | 248/562 |
| 2010/0147914 A1* | 6/2010 | Sautter | .................... | B60R 9/055 |
| | | | | 224/325 |
| 2010/0181438 A1* | 7/2010 | Chauzu | ................ | H02G 3/0456 |
| | | | | 248/49 |
| 2012/0097670 A1* | 4/2012 | Edwards | ................ | B65D 85/66 |
| | | | | 220/1.5 |
| 2012/0128452 A1 | 5/2012 | Murata et al. | | |
| 2012/0175489 A1* | 7/2012 | Taylor | ................... | F16F 15/067 |
| | | | | 248/563 |
| 2012/0248282 A1* | 10/2012 | Malchev | ................ | F16F 15/027 |
| | | | | 248/550 |
| 2013/0009033 A1* | 1/2013 | Pedersen | ............ | B65D 90/0033 |
| | | | | 248/562 |
| 2013/0200022 A1* | 8/2013 | Davis | ........................ | B62B 3/02 |
| | | | | 211/85.8 |
| 2013/0292541 A1* | 11/2013 | Taylor | .................... | F16F 15/067 |
| | | | | 248/562 |
| 2013/0299375 A1* | 11/2013 | Chen | ....................... | B29C 33/48 |
| | | | | 206/454 |
| 2014/0083554 A1* | 3/2014 | Harris | .................... | B65D 88/32 |
| | | | | 141/1 |
| 2014/0151513 A1* | 6/2014 | Valdes Colina | ...... | H02G 3/0443 |
| | | | | 248/49 |
| 2014/0305334 A1* | 10/2014 | Blase | ..................... | B61C 17/00 |
| | | | | 105/26.05 |
| 2015/0068997 A1* | 3/2015 | Nomura | ..................... | B65G 1/02 |
| | | | | 211/134 |
| 2015/0144763 A1* | 5/2015 | Aeffner | ..................... | F16M 5/00 |
| | | | | 248/562 |
| 2015/0276008 A1* | 10/2015 | Goold | ..................... | F16F 13/00 |
| | | | | 248/562 |

FOREIGN PATENT DOCUMENTS

| | | |
|---|---|---|
| JP | 2008-89114 A | 4/2008 |
| JP | 2008-133075 A | 6/2008 |
| JP | 2011-29550 A | 2/2011 |
| JP | 2012-15371 A | 1/2012 |

* cited by examiner

STORAGE SHELF

BACKGROUND OF THE INVENTION

1. Field of the Invention

The present invention relates to a storage shelf that stores therein a front-opening unified pod (FOUP).

2. Description of the Related Art

A semiconductor conveyance system is provided with a storage shelf that temporarily stores therein FOUPs as wafer carriers. Examples of the storage shelf include one provided along a track of an overhead carrier and one suspended from a ceiling, such storage shelves may be subjected to vibration transmitted when the overhead carrier travels. Because wafers are products that require high precision, it is desired to reduce the effect of the vibration.

As a mechanism for preventing vibration, one described in Japanese Patent Application Laid-Open Publication No. 2012-15371, for example, is known. In the one described in Japanese Patent Application Laid-Open Publication No. 2012-15371, a receiving base on which a load is placed is provided with a viscoelastic body.

In general, to reduce vibration by using a vibration-isolating member (elastic body), the spring constant of the vibration-isolating member needs to be set lower so that the ratio of natural frequency of a system including an object to be vibration-isolated and the vibration-isolating member to the natural frequency of an input vibration becomes higher. However, when the spring constant of the vibration-isolating member is set lower, a problem may occur in that the object to be vibration-isolated cannot be supported while the elasticity of the vibration-isolating member is maintained.

SUMMARY OF THE INVENTION

Preferred embodiments of the present invention provide a storage shelf that reduces vibration while maintaining load-carrying capacity.

A storage shelf according to one aspect of various preferred embodiments of the present invention is a storage shelf including a placement unit on which an object is able to be placed and a frame unit that supports the placement unit. The placement unit includes a frame that is arranged on a frame unit with a first elastic body interposed therebetween and a shelf plate that is arranged on the frame with a second elastic body interposed therebetween and on which the object is able to be placed.

In this storage shelf, the frame is arranged on the frame unit with the first elastic body interposed therebetween, and the shelf plate on which the object is placed is arranged on the frame with the second elastic body interposed therebetween. Accordingly, in the storage shelf, the first elastic body and the second elastic body are provided in series. Thus, in the storage shelf, it is possible to set a spring constant at a lower value to obtain a vibration-isolating effect while maintaining load-carrying capacity.

In one preferred embodiment of the present invention, the object may be a front-opening unified pod (FOUP) configured to accommodate therein wafers. The placement unit may include a third elastic body arranged between the frame and the shelf plate and having a rigidity higher than those of the first and the second elastic bodies. The third elastic body may be arranged on a side where a lid of the FOUP is positioned when the FOUP is placed on the shelf plate. In general, the side near the lid is heavier than other sides in the FOUP. This shifts the center of gravity of the FOUP toward the side near the lid. In view of this, in the storage shelf, the third elastic body having the rigidity higher than those of the first and the second elastic bodies is arranged on the side where the lid of the FOUP is positioned. This enables the storage shelf to reduce vibration and also prevent the FOUP from tilting.

In one preferred embodiment of the present invention, the frame unit may include a pair of beam members facing each other. The frame may be disposed over the pair of beam members. The frame may include a concave portion positioned between the pair of beam members and including a base portion extending in an opposing direction of the pair of beam members and a pair of raised portions that are raised from both ends of the base portion, and include overhanging portions that overhang from ends of the raised portions and are mounted on the beam members each with the first elastic body interposed therebetween. The second elastic body may be arranged on the concave portion of the frame. This arrangement enables the storage shelf to prevent the position of the shelf plate from becoming higher even when the first elastic body and the second elastic body are provided in series. Thus, in the storage shelf, space in the height direction of the placement unit is able to be saved.

In one preferred embodiment of the present invention, the frame unit may be secured to a rail of a traveling vehicle or to a supporting member supporting the rail. This arrangement enables the storage shelf to simplify the configuration without the need to provide an additional member for supporting the storage shelf.

A storage shelf according to another aspect of various preferred embodiments of the present invention is a storage shelf including a placement unit on which an object is able to be placed and a frame unit that supports the placement unit and is secured to a rail of a traveling vehicle or to a supporting member supporting the rail. The placement unit is arranged on the frame unit with an elastic body interposed therebetween, and includes a shelf plate on which the object is able to be placed.

In this storage shelf, the placement unit is arranged on the frame unit secured to the rail or the supporting member with the elastic body interposed therebetween. Accordingly, vibration that occurs at the rail when the traveling vehicle travels is able to be prevented from being transmitted from the frame unit to the placement unit, such that the vibration of the object is reduced.

Preferred embodiments of the present invention reduce vibration while maintaining load-carrying capacity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
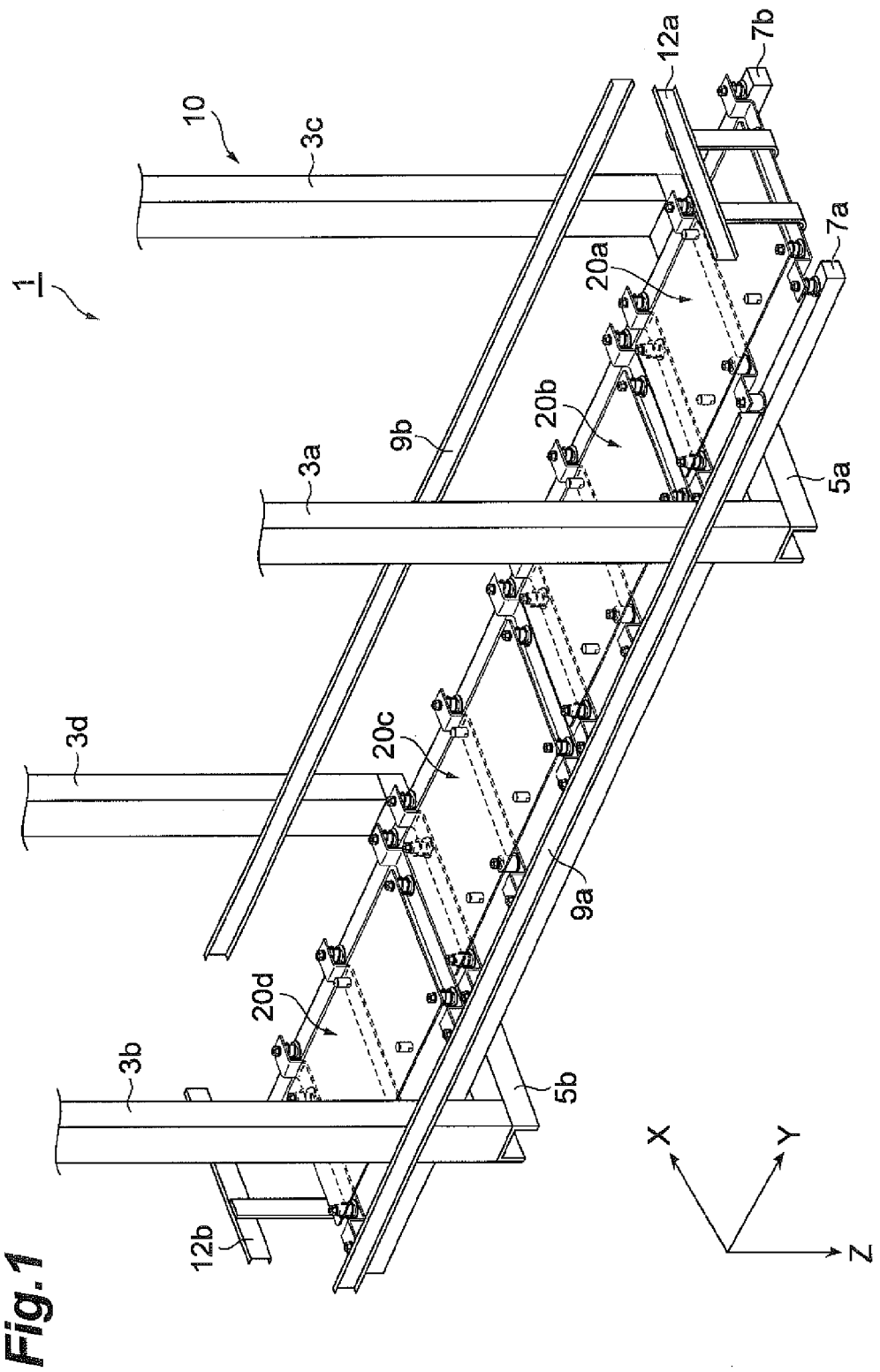
FIG. 1 is a perspective view illustrating a storage shelf according to a preferred embodiment of the present invention.

Preferred embodiments of the present invention will be described hereinafter in detail with reference to the attached drawings. In the description of the drawings, like reference signs are given to like or equivalent elements, and duplicated explanation is omitted. The terms "X-direction", "Y-direction", and "Z-direction" are based on directions depicted in the drawings and are given for convenience.

First Preferred Embodiment

FIG. 1 is a perspective view illustrating a storage shelf according to a preferred embodiment of the present invention. This storage shelf 1 depicted in FIG. 1 is installed in a semiconductor conveyance system of a semiconductor manufacturing plant, for example. The storage shelf 1 stores therein a front-opening unified pod (FOUP: wafer carrier) 100 (see FIG. 3) accommodating wafers. The FOUP 100 accommodates a plurality of wafers each preferably having a diameter of 300 millimeters or 450 millimeters, for example.

The storage shelf 1 includes a frame unit 10 and placement units 20a, 20b, 20c, and 20d. The frame unit 10 supports the placement units 20a to 20d. The frame unit 10 includes suspending members 3a, 3b, 3c, and 3d, connecting members 5a and 5b, and beam members 7a and 7b.

The suspending members 3a to 3d are pillar members extending in the vertical direction (Z-direction), provided in plurality (for example, preferably four in the present preferred embodiment). The suspending members 3a to 3d are arranged facing each other spaced at predetermined intervals in the X-direction and the Y-direction. The suspending members 3a to 3d are secured to any one of a rail of an overhead carrier (traveling vehicle), a supporting member supporting this rail, and a ceiling. On the lower-end side of the suspending members 3a and 3b, a fence member 9a is laterally provided extending in the Y-direction. On the lower-end side of the suspending members 3c and 3d, a fence member 9b is laterally provided extending in the Y-direction. The fence members 9a and 9b prevent the FOUP 100 from falling.

The connecting member 5a is a member extending in the X-direction, and connects the lower ends of the suspending member 3a and the suspending member 3c. The connecting member 5b is a member extending in the X-direction, and connects the lower ends of the suspending member 3b and the suspending member 3d.

The beam members 7a and 7b are members extending in the Y-direction, and are disposed over the connecting members 5a and 5b. The beam members 7a and 7b face each other spaced at a predetermined distance in the X-direction.

On the placement units 20a to 20d, the FOUP 100 is placed. The placement units 20a to 20d are supported by the frame unit 10. The placement units 20a to 20d are arranged in plurality (four herein) along the Y-direction in the frame unit 10. The respective placement units 20a to 20d preferably have the same configuration, for example. The following describes the placement unit 20a as one example in detail.

Figure 2:
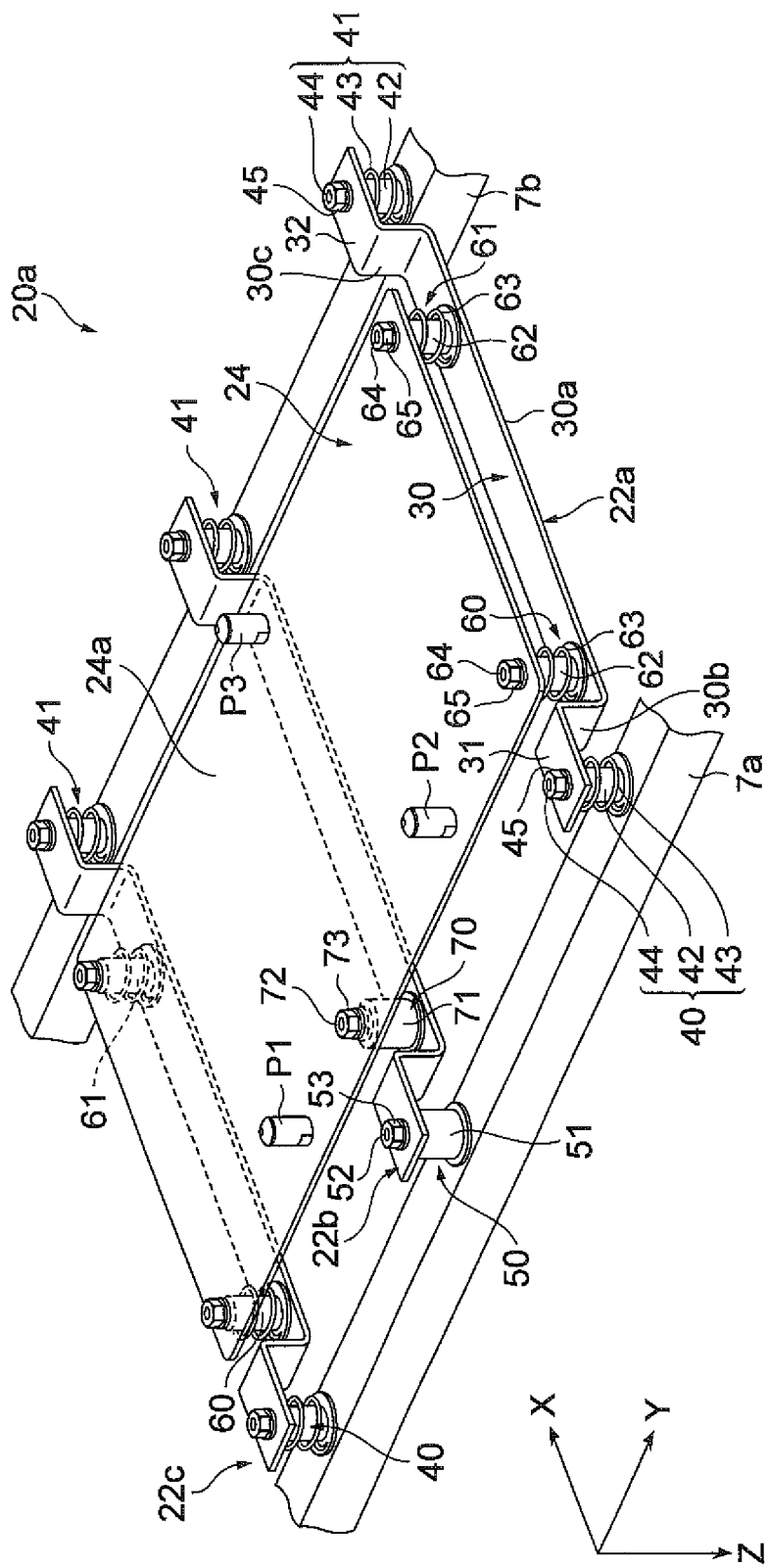
FIG. 2 is a perspective view illustrating a placement unit.
Figure 3:
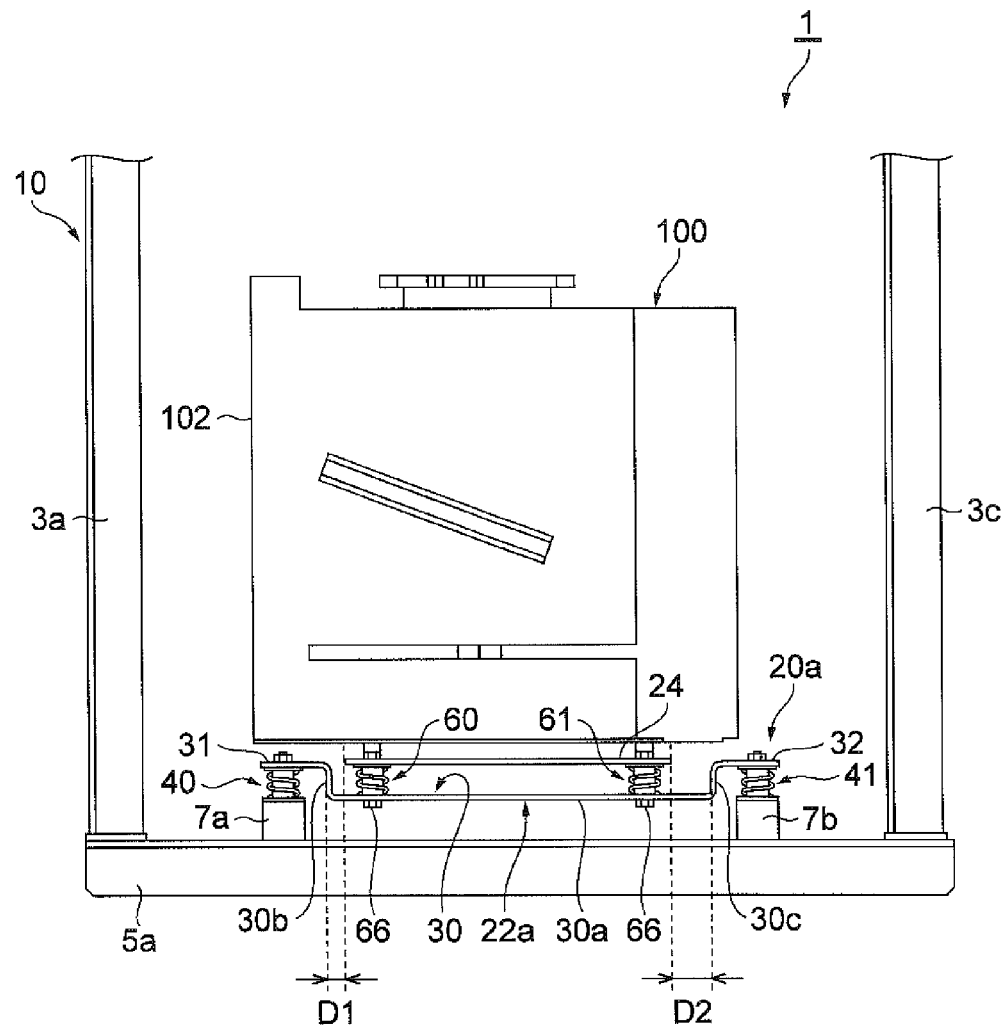
FIG. 3 is a side view of the storage shelf on which a FOUP is placed.

FIG. 2 is a diagram illustrating the placement unit. FIG. 3 is a side view of the storage shelf on which the FOUP is placed. As depicted in FIG. 2 and FIG. 3, the placement unit 20a includes frames 22a, 22b, and 22c and a shelf plate 24.

The frames 22a to 22c are disposed over the beam members 7a and 7b. The frames 22a to 22c are arranged in this order spaced at a predetermined distance in the Y-direction. In other words, the frame 22b is arranged between the frame 22a and the frame 22c (substantially at the center). The respective frames 22a to 22c have the same configuration. The following describes the frame 22a as one example in detail.

The frame 22a includes a concave portion 30 having a concave shape and overhanging portions 31 and 32 overhanging from ends of the concave portion 30 to both sides. The frame 22a is a plate-shaped member, which is preferably formed integrally with a concave portion 30 and overhanging portions 31 and 32 by sheet-metal processing, for example.

The concave portion 30 includes a base portion 30a extending in the X-direction (opposing direction of the pair of beam members 7a and 7b) and raised portions 30b and 30c that are raised in a vertical or substantially vertical manner from ends in the X-direction (longitudinal direction) of the base portion 30a. The overhanging portions 31 and 32 respectively overhang from the upper ends of the raised portions 30b and 30c, each extending outside in the X-direction. The overhanging portions 31 and 32 are parallel or substantially parallel to the base portion 30a.

The frame 22a is arranged on the beam members 7a and 7b with the first elastic bodies 40 and 41 interposed therebetween. Specifically, the overhanging portions 31 and 32 of the frame 22a are arranged on the beam members 7a and 7b with the first elastic bodies 40 and 41 interposed therebetween. The first elastic bodies 40 and 41 preferably have the same configuration, for example. The following describes the first elastic body 40 as one example in detail.

The first elastic body 40 preferably includes a gel member 42, a coil spring 43, and a vertical pair of screw portions 44. The gel member 42 is arranged inside the coil spring 43. The screw portions 44 are configured so that a screw protrudes upward or downward from a disk-shaped base portion, and are provided so that the gel member 42 and the coil spring 43 are sandwiched between the vertical pair of the screw portions 44.

The frame 22a is fixed on the first elastic bodies 40 and 41 (specifically, on the base portions of the screw portions 44) with nuts 45, with the screw portions 44 of the first elastic bodies 40 and 41 being inserted into through holes (not depicted) provided in the overhanging portions 31 and 32. Similarly, the first elastic bodies 40 and 41 are fixed on the beam members 7a and 7b with nuts (not depicted). In this manner, the frame 22a is fixed on the beam members 7a and 7b with the first elastic bodies 40 and 41 interposed therebetween.

The overhanging portion 31 of the frame 22b is arranged on the beam member 7a with the third elastic body 50 interposed therebetween. The third elastic body 50 includes a gel member 51 and a vertical pair of screw portions 52. The screw portions 52 are configured so that a screw protrudes upward or downward from a disk-shaped base portion, and are provided so that the gel member 51 is sandwiched between the vertical pair of the screw portions 52. The third elastic body 50 has a rigidity higher than those of the first elastic bodies 40 and 41 and second elastic bodies 60 and 61 described later. In other words, the proper load of the third elastic body 50 is higher than the proper load of the first elastic bodies 40 and 41.

The frame 22b is fixed on the third elastic body 50 (specifically, on the base portion of the screw portions 52) with a nut 53, with the screw portions 52 of the third elastic body 50 being inserted into a through hole (not depicted) provided in the overhanging portion 31. The third elastic body 50 is fixed on the beam member 7a with a nut (not depicted). In this manner, the frame 22b is fixed on the beam member 7a with the third elastic body 50 interposed therebetween. The overhanging portion 32 of the frame 22b is fixed on the beam member 7b with the first elastic body 41 interposed therebetween.

In the storage shelf 1, the placement units 20a and 20d positioned at both ends in the Y-direction are provided with fence members 12a and 12b. The fence member 12a is secured to the base portion 30a of the frame 22a of the placement unit 20a. The fence member 12b is secured to the base portion 30a of the frame 22c of the placement unit 20d. The fence members 12a and 12b prevent the FOUP 100 from falling.

The shelf plate 24 is a plate-shaped member having a rectangular or substantially rectangular shape, and the FOUP 100 is placed thereon. The shelf plate 24 includes a placement surface 24a on which the FOUP 100 is placed. The shelf plate 24 has a width in the X-direction smaller than the distance between the raised portions 30b and 30c of frames 22a to 22c, and is positioned above the concave portions 30 of the frames 22a to 22c.

The shelf plate 24 is provided with pins P1, P2, and P3. The pins P1 to P3 protrude upward from the placement surface 24a of the shelf plate 24. The pins P1 to P3 are arranged at positions corresponding to locating holes (not depicted) provided in the bottom of the FOUP 100. In the present preferred embodiment, the FOUP 100 is placed on the shelf plate 24 in such a direction that a lid 102 is positioned on the left in the drawing.

The shelf plate 24 is arranged on the frames 22a and 22c with the second elastic bodies 60 and 61 interposed therebetween. Specifically, the shelf plate 24 is arranged on the concave portions 30 of the base portions 30a of the frames 22a and 22c with the second elastic bodies 60 and 61 interposed therebetween. The second elastic bodies 60 and 61 preferably have the same configuration, for example. The following describes the second elastic body 60 as one non-limiting example in detail.

The second elastic bodies 60 preferably have the same configuration as that of the first elastic bodies 40 and 41, and each include a gel member 62, a coil spring 63, and a vertical pair of screw portions 64. The gel member 62 is arranged inside the coil spring 63. The screw portions 64 are configured so that a screw protrudes upward or downward from a disk-shaped base portion, and are provided so that the gel member 62 is sandwiched between the vertical pair of the screw portions 64. The proper load of the second elastic bodies 60 and 61 is the same or substantially the same as the proper load of the first elastic bodies 40 and 41.

The shelf plate 24 is fixed on the second elastic bodies 60 and 61 (specifically, on the base portions of the screw portions 64) with nuts 65, with the screw portions 64 of the second elastic bodies 60 and 61 being inserted into through holes (not depicted) of the shelf plate 24. The second elastic bodies 60 and 61 are fixed on the base portions 30a of the frames 22a and 22c with nuts 66. In this manner, the shelf plate 24 is fixed on the frames 22a and 22c with the second elastic bodies 60 and 61 interposed therebetween.

The second elastic bodies 60 and the second elastic bodies 61 are fixed on corners of the shelf plate 24, spaced at a predetermined distance. In the present preferred embodiment, the mounting positions of the second elastic bodies 60 and 61 with respect to the frames 22a and 22c are closer to the lid 102 of the FOUP 100 when the FOUP 100 is placed on the shelf plate 24 as depicted in FIG. 3. Specifically, the mounting positions of the second elastic bodies 60 and 61 with respect to the frames 22a and 22c are preferably set at positions such that the distance D1 between the front end (left end in the drawing) of the shelf plate 24 and the raised portion 30b is smaller than the distance D2 between the rear end (right side in the drawing) of the shelf plate 24 and the raised portion 30c.

The shelf plate 24 is also arranged on the frame 22b with the fourth elastic body (third elastic body) 70 interposed therebetween. Specifically, the shelf plate 24 is arranged on the base portion 30a of the concave portion 30 of the frame 22b with the fourth elastic body 70 interposed therebetween. The fourth elastic body 70 is arranged on the side near the lid 102 of the FOUP 100 when the FOUP 100 is placed on the shelf plate 24.

The fourth elastic body 70 preferably has the same configuration as that of the third elastic body 50, and includes a gel member 71 and a vertical pair of screw portions 72. The screw portions 72 are configured so that a screw protrudes upward or downward from a disk-shaped base portion, and are provided so that the gel member 71 is sandwiched between the vertical pair of the screw portions 72. The fourth elastic body 70 has a rigidity higher than those of the first elastic bodies 40 and 41 and the second elastic bodies 60 and 61. The proper load of the fourth elastic body 70 is the same or substantially the same as the proper load of the third elastic body 50.

The shelf plate 24 is fixed on the fourth elastic body 70 with a nut 73, with the screw portions 72 of the fourth elastic body 70 being inserted into a through hole (not depicted) of the shelf plate 24. The fourth elastic body 70 is fixed on the base portion 30a of the frame 22b with the nut 73. In this manner, the shelf plate 24 is fixed on the frame 22b with the fourth elastic body 70 interposed therebetween.

The height position of the shelf plate 24 is the same or substantially the same as the height position of the overhanging portions 31 and 32 of the frames 22a to 22c.

As described above, in the storage shelf 1 of the present preferred embodiment, the frames 22a to 22c are disposed over the beam members 7a and 7b with the first elastic bodies 40 and 41 and the third elastic body 50 interposed therebetween, and the shelf plate 24 on which the FOUP 100 is placed is arranged on the frames 22a and 22c with the second elastic bodies 60 and 61 interposed therebetween. Accordingly, in the storage shelf 1, the first elastic bodies 40 and 41 and the second elastic bodies 60 and 61 are provided in series. Thus, it is possible to reduce vibration by setting the spring constant at a lower value to obtain the vibration-isolating effect while maintaining load-carrying capacity.

Herein, the side near the lid 102 of the FOUP 100 is heavier, which shifts the center of gravity to the side near the lid 102. This shifting may cause the FOUP 100 to tilt toward the lid 102 when the FOUP 100 is placed on the shelf plate 24.

In view of this, in the present preferred embodiment, on the side where the lid 102 of the FOUP 100 is positioned, the third elastic body 50 and the fourth elastic body 70 preferably have rigidities higher than those of the first elastic bodies 40 and 41 and the second elastic bodies 60 and 61. In other words, in the placement units 20a to 20d, more elastic bodies are arranged on the side near the lid 102 of the FOUP 100 than on the opposite side away from the lid 102, and also the elastic bodies on the side near the lid 102 have higher rigidities. Furthermore, in the present preferred embodiment, on the concave portions 30 of the frames 22a to 22c, the second elastic bodies 60 and 61 and the fourth elastic body 70 are arranged closer to the side where the lid 102 of the FOUP 100 is positioned. Based on these arrangements in the present preferred embodiment, by arranging the elastic bodies in accordance with the center of gravity of the FOUP 100, the FOUP 100 is prevented from tilting toward the lid 102.

In the present preferred embodiment, the frames 22a to 22c have the concave portions 30 positioned between the pair of the beam members 7a and 7b. The shelf plate 24 is arranged above the concave portions 30 of the frames 22a to 22c. This arrangement allows the height position of the shelf plate 24 to be the same or substantially the same as the height position of the overhanging portions 31 and 32 of the frames 22a to 22c. Thus, in the storage shelf 1, even with the configuration in which the first elastic bodies 40 and 41 and the second elastic bodies 60 and 61 are provided in series, space in the height direction of the placement units 20a to 20d is saved.

Figure 4:
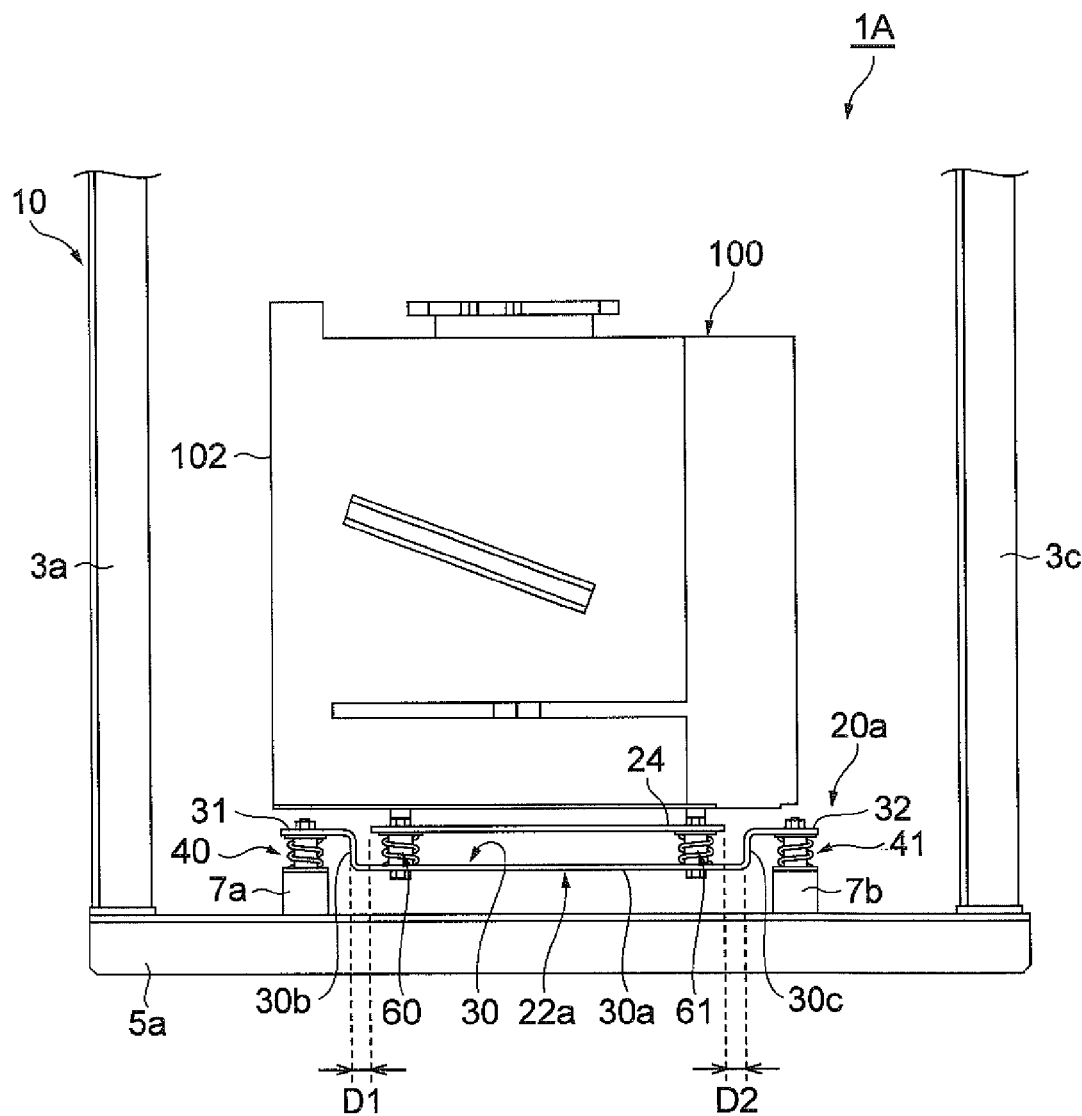
FIG. 4 is a side view of a storage shelf according to a modified example of the first preferred embodiment of the present invention.

FIG. 4 is a side view of a storage shelf according to a modified example of the first preferred embodiment of the present invention. As depicted in FIG. 4, in this storage shelf 1A, the distance D1 between the front end (left end in the drawing) of the shelf plate 24 and the raised portion 30b is the same or substantially the same as the distance D2 between the rear end (right side in the drawing) of the shelf plate 24 and the raised portion 30c. In the storage shelf 1A, on the side near the lid 102 of the FOUP 100, it is preferable that the first elastic body 40 and the second elastic body 60 preferably have rigidities higher than those of elastic bodies arranged on the opposite side away from the lid 102. This arrangement enables the storage shelf 1A to prevent the FOUP 100 from tilting.

In the above-described preferred embodiment, the first elastic bodies 40 and 41, the second elastic bodies 60 and 61, the third elastic body 50, and the fourth elastic body 70 are used, but alternatively only the first elastic bodies 40 and 41 and the second elastic bodies 60 and 61 may be used. In this case, it is preferable that the shelf plate 24 be arranged closer to the lid 102 of the FOUP 100.

Second Preferred Embodiment

Figure 5:
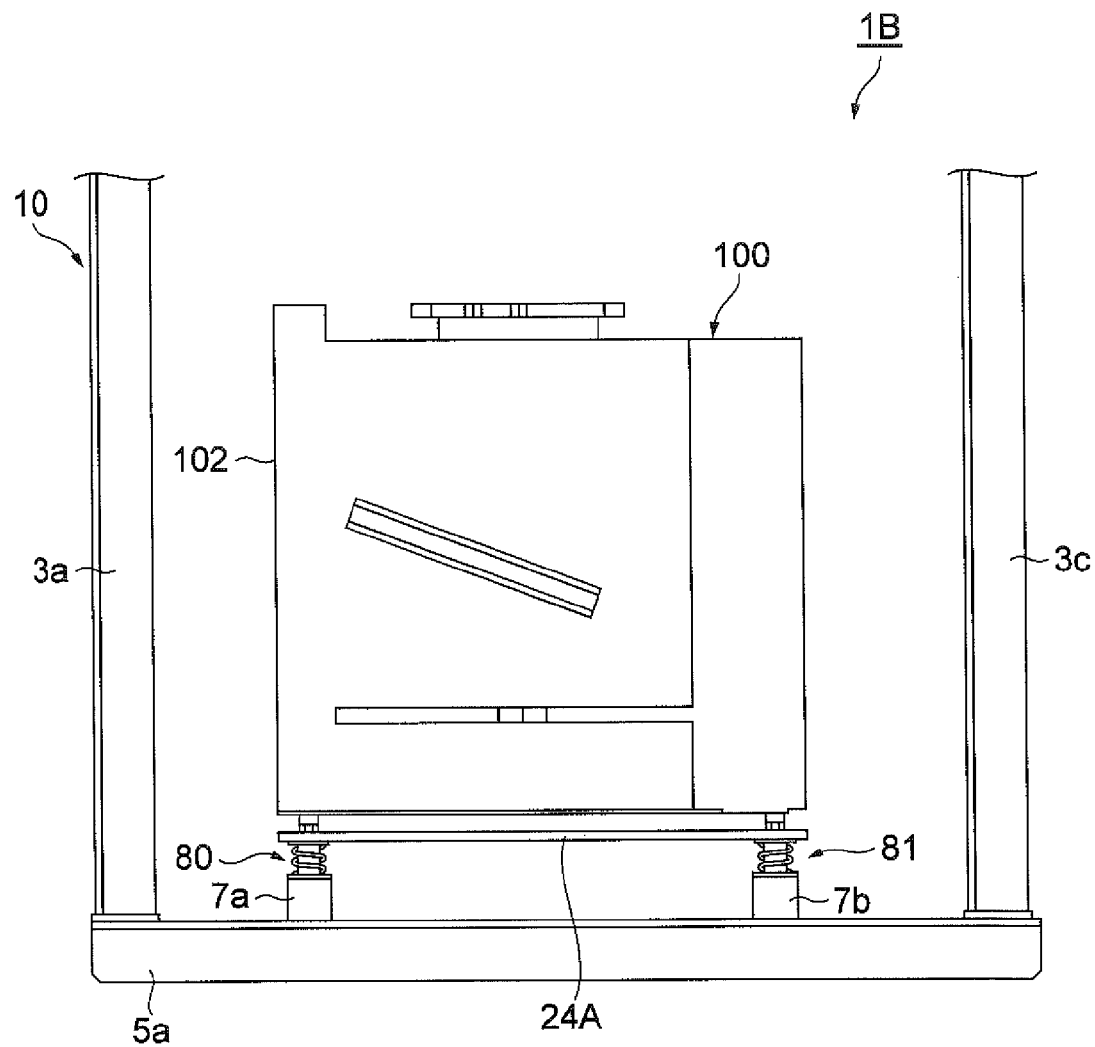
FIG. 5 is a side view of a storage shelf according to a second preferred embodiment of the present invention.

A second preferred embodiment of the present invention will be described hereinafter. FIG. 5 is a side view of a storage shelf according to the second preferred embodiment. As depicted in FIG. 5, this storage shelf 1B includes the frame unit 10 and the placement unit 20a (20b, 20c, 20d (see FIG. 1)). The frame unit 10 supports the placement unit 20a (20b to 20d). The frame unit 10 includes the suspending members 3a to 3d (see FIG. 1), the connecting members 5a and 5b, and the beam members 7a and 7b.

The placement unit 20a includes a shelf plate 24A. The shelf plate 24A is a plate-shaped member having a rectangular or substantially rectangular shape, and the FOUP 100 is placed thereon. The shelf plate 24A has a width in the X-direction larger than the distance between the beam members 7a and 7b, and is arranged over the beam members 7a and 7b. The shelf plate 24A is arranged on the beam members 7a and 7b with the elastic bodies 80 and 81 interposed therebetween.

The elastic bodies 80 and 81 have the same configuration as that of the first elastic bodies 40 and 41 of the first preferred embodiment. On the side near the lid 102 of the FOUP 100, it is preferable that the elastic body 80 be arranged that has rigidity higher than that of an elastic body arranged on the opposite side away from the lid 102.

At the center in the Y-direction of the shelf plate 24A, the third elastic body 50 depicted in FIG. 2 is provided on the side near the lid 102 of the FOUP 100. The third elastic body 50 has a rigidity higher than those of the elastic bodies 80 and 81. In other words, the proper load of the third elastic body 50 is higher than the proper loads of the elastic bodies 80 and 81. At the center in the Y-direction of the shelf plate 24A, the elastic body 81 is provided on the other side away from the lid 102 of the FOUP 100.

As described above, in the storage shelf 1B of the present preferred embodiment, the shelf plate 24A is disposed over the beam members 7a and 7b with the elastic bodies 80 and 81 and the third elastic body 50 interposed therebetween. In this manner, in the storage shelf 1B, the placement unit 20a (shelf plate 24A) is arranged on the frame unit 10 that is secured to the rail or the supporting member with the elastic bodies 80 and 81 interposed therebetween. Accordingly, vibration that occurs at the rail when the overhead carrier (traveling vehicle) travels is prevented from being transmitted from the frame unit 10 to the placement unit 20a, such that vibration of the FOUP 100 is significantly reduced. Thus, in the storage shelf 1B, it is possible to set a spring constant at a lower value to obtain a vibration-isolating effect while maintaining load-carrying capacity.

In the storage shelf 1B of the present preferred embodiment, the third elastic body 50 having a rigidity higher than those of the elastic bodies 80 and 81 is arranged on the side where the lid 102 of the FOUP 100 is positioned. In addition, the elastic body 80 has a rigidity higher than that of the elastic body 81. In other words, in the placement units 20a to 20d, more elastic bodies are arranged on the side near the lid 102 of the FOUP 100 than on the opposite side away from the lid 102, and the elastic bodies on the side near the lid 102 have higher rigidities. Based on these arrangements in the present preferred embodiment, by arranging the elastic bodies in accordance with the center of gravity of the FOUP 100, the FOUP 100 is prevented from tilting toward the lid 102.

In the above-described preferred embodiment, the elastic bodies 80 and 81 and the third elastic body 50 preferably are used, but alternatively only the elastic bodies 80 and 81 may be used.

The present invention is not limited to the above-described preferred embodiments. In the above-described preferred embodiments, configurations including a plurality of frames 22a to 22c have been described as one example, but alternatively one frame may be used.

Positions of the elastic bodies to be arranged, the number of the elastic bodies, and the types of the elastic bodies may be appropriately set in accordance with the weight or the center of gravity of an object to be vibration-isolated.

In the above-described preferred embodiments, the configurations in which the FOUP 100 is stored in the storage shelf 1 have been described as one non-limiting example, but alternatively the object may be another type of wafer carrier such as a front opening shipping box (FOSB) or a multiple application carrier (MAC).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A storage shelf configured to reduce the vibration of objects stored thereon, the storage shelf comprising: a placement unit on which an object is able to be placed; and a frame unit that supports the placement unit; wherein the placement unit includes:
    a frame that is arranged on a frame unit with a first elastic body interposed therebetween; and
    a shelf plate that is arranged on the frame with a second elastic body interposed therebetween and on which the object is to be placed;
    wherein the frame unit includes a pair of beam members facing each other; the frame is disposed over the pair of beam members and includes: a concave portion positioned between the pair of beam members and including a base portion extending in an opposing direction of the pair of beam members and a pair of raised portions that are raised from both ends of the base portion; and overhanging portions that overhang from ends of the raised portions and are mounted on the beam members each with the first elastic body interposed therebetween; and the second elastic body is arranged on the concave portion of the frame.

2. The storage shelf according to claim 1, wherein, when in use, the object is a front-opening unified pod configured to accommodate therein wafers;

the placement unit includes a third elastic body arranged between the frame and the shelf plate, the third elastic body having a rigidity higher than those of the first and the second elastic bodies; and the third elastic body is arranged on a side where a lid of the front-opening unified pod is positioned when the front-opening unified pod is placed on the shelf plate.

3. The storage shelf according to claim 1, wherein the frame unit is capable of being secured to a rail of a traveling vehicle.

* * * * *